United States Patent [19]

Freeman et al.

[11] Patent Number: 4,906,993
[45] Date of Patent: Mar. 6, 1990

[54] KEYBOARD SCANNER APPARATUS AND METHOD

[75] Inventors: Mark S. Freeman, Snohomish; Brian S. McElhinney, Kirkland, both of Wash.

[73] Assignee: John Fluke Mfg. Co., Inc., Everett, Wash.

[21] Appl. No.: 177,078

[22] Filed: Apr. 4, 1988

[51] Int. Cl.⁴ .................. H03M 11/00; G06F 3/02
[52] U.S. Cl. ............................. 341/26; 341/22
[58] Field of Search ............ 341/26, 22, 23, 24, 341/25, 95; 340/711, 712

[56] References Cited

U.S. PATENT DOCUMENTS 4,570,154  2/1986  Kinghorn ..................... 341/26
4,673,933  6/1987  Bauer ......................... 341/22
4,709,228 11/1987  Hucking ...................... 341/26

FOREIGN PATENT DOCUMENTS

EP0094130 11/1983
EP0188151  7/1986  European Pat. Off. .
0035324   4/1978  Japan ......................... 341/25
0175135   9/1985  Japan ......................... 341/26
1569604  11/1975  United Kingdom .
2162351   1/1986  United Kingdom ............. 341/25

Primary Examiner—Donald J. Yusko
Assistant Examiner—Yuk H. Lau
Attorney, Agent, or Firm—Mikio Ishimaru; Stephen A. Becker

[57] ABSTRACT

A digital keypad input device comprises a controller for driving a plurality of I/O signal lines selectively in input, output, and high impedance states. Each line operated in the output state presents an output logic signal that is detected, via a corresponding switch when closed, by another I/O line operated in the input state. Other lines are operated in the high impedance state. The method of the invention enables the number of manual switches to exceed the number of I/O lines.

20 Claims, 2 Drawing Sheets

KEYBOARD SCANNER APPARATUS AND METHOD

TECHNICAL FIELD

This invention is related generally to data input and more particularly toward scanning type digital keypad input devices and scanning methods therefor.

BACKGROUND ART

Keyboards used to input data to a digital processor use several techniques to identify an activation of a particular keyboard switch. In one type of keyboard all input switches are connected to an input bus to output a unique binary value onto the bus upon switch activation. Because all switches are connected to a common input bus, to avoid erroneous decoding of the binary values, logic circuitry provided therein avoids simultaneous activation of more than one switch. This technique, however, requires each switch to have its own encoding circuitry and does not support multiple key inputs of a type that require simultaneous activation of more than one switch at a time.

To avoid encoding circuitry at each input switch, each switch can be associated with a particular I/O input line. However, if the number of input switches exceeds the available number of I/O input lines, the processor must use a separate multiplexer to selectively connect banks of switches to the available lines. The processor then scans through the banks of switches by signalling the multiplexer circuit to sequentially poll banks of switch inputs to the input bus of the processor. In addition to the external multiplexer circuit required, this technique requires individual wiring between each of the input switches and the multiplexer circuit. Further, the processor first must designate to the multiplexer the desired switch bank to be polled prior to detecting a switch activation; this often requires the processor to use the same I/O lines to establish the designation that are used to input the data from the multiplexer.

A need therefore exists to provide a scanning type of input keyboard having a number of input switches greater than the number of available I/O lines available without a dedicated multiplexer. Further, a need exists for minimizing the number of wires required to detect and identify an input switch activation while avoiding individual logic circuitry to encode switch activation and detect combinations of simultaneous switch inputs.

Accordingly, an object of the invention is to minimize the number of I/O lines needed to input data from a digital keyboard without multiplexing.

Another object of the invention is to provide a digital input keyboard input device and method for eliminating encoding of individual input keys onto an I/O bus.

A further object of the invention is to provide a digital keyboard input device and method for detecting and identifying simultaneous multiple key inputs.

Still another object of the invention is to provide a digital keyboard input device and method of detecting an ambiguous input therefrom.

A further object of the invention is to provide a digital keyboard input device which includes debouncing of input switches to correctly detect simultaneous multiple switch inputs.

DISCLOSURE OF THE INVENTION

In accordance with one aspect of the invention, a digital keypad input device includes a plurality of I/O signal lines, each of which is selectively operable to have (a) a high impedance state, (b) an input state for carrying an input logic signal and (c) an output state for carrying an output logic signal. A first plurality of manually operable data input switches each provide, when operated, an electrical path between a corresponding one of the I/O signal lines and another one of the I/O signal lines.

Control logic circuitry selectively operates the I/O signal lines one at a time in the output state for generating the output logic signal. The control logic operates at least one other of the I/O signal lines in the input state for receiving the output logic signal from a selected I/O signal line in the output state via an operated switch. Other ones of the I/O signal lines are operated in the high impedance state.

In response to the signals generated and received, the control logic circuitry determines which one or ones of the plurality of manually operable data input switches are the operated switches.

In accordance with another aspect of the invention, a digital keypad input device includes a plurality of I/O signal lines, with a first one of the plurality of I/O signal lines operable to have an input state for carrying an input logic level signal; a second one of the plurality of I/O lines operable selectively in (a) the input state and (b) an output state for carrying an output logic signal; and remaining ones of the plurality of I/O signal lines operable selectively in (a) the input state, (b) the output state, and (c) a high impedance state.

A plurality of manually operable data input switches each provide, when operated, an electrical path between a corresponding one of the I/O signal lines and another one of the I/O signal lines. A control circuit operates the second one and the remaining I/O signal lines selectively, one at a time, in the output state to generate the output logic signal while operating at least the first I/O signal line in the input state and receiving the output logic signal from a selected I/O signal line in the output state through an operated switch. The other ones of the I/O signal lines are operated in the high impedance state with the control circuitry determining which one or ones of the plurality of manually operable data input switches are the operated switches in response to the signals generated and received.

The data input switches include a plurality of first switches, each of the I/O signal lines connectable respectively to all others of the I/O signal lines through the plurality of first switches. A plurality of second switches apply the reference logic signal to corresponding ones of the I/O signal lines. The control circuitry includes circuitry to operate the I/O lines in the input state for receiving output logic and reference logic signal on the I/O lines.

In accordance with another aspect of the invention, the input device further includes a source of a reference logic signal and second manually operable data input switches for selectively providing the reference signal to a corresponding I/O signal line.

In accordance with still another aspect of the invention, the input state and the high impedance state have a common electrical characteristic. Further, control circuitry generates an error signal upon receiving the output logic signal from two different I/O signal lines operated in the output state.

Another aspect of the invention includes keypad encoding where each of the I/O signal lines has an associated binary weighting. The control circuitry includes circuitry for generating a binary value corresponding to a sum of (a) a binary weighting of each I/O line on which the logic level signal is received and (b) a binary offset value corresponding to any I/O signal line being operated in the output state, the offset value being greater than a maximum binary weighting value of the I/O signal lines. To eliminate false outputs, the device further includes debouncing circuitry for outputting a maximum binary value corresponding to a plurality of the calculated binary values.

In accordance with other aspects of the invention the control circuitry sequentially operates each of the I/O signal lines in the output state and/or operates all of the I/O signal lines in the input state and operates each of the I/O signal lines sequentially in the output state. Diodes are provided for establishing a unidirectional current path through the switches.

In accordance with still another aspect of the invention, a digital keypad input device includes a source of a reference logic signal. A plurality of I/O signal lines are each selectively operable to have (a) a high impedance state, (b) an input state for carrying an input logic signal level and (c) an output state for carrying an output logic signal. A first plurality of switches are each operable to provide an electrical path between a corresponding one of the I/O signal lines and all others of the I/O signal lines. A second plurality of switches are each operable to apply the reference logic signal to a corresponding one of the I/O signal lines.

An I/O controller operates the plurality of I/O signal lines in the input state and detects a reference logic signal and an output logic signal on one of the I/O signal lines corresponding to an operation of one of the second switches. The controller further operates one of the plurality of I/O signal lines in an output state and the remaining ones of the plurality of I/O signal lines in an input state to detect the output logic signal on at least one of the plurality of I/O signal lines thereby to detect any operation of at least one of the plurality of first switches.

In accordance with still another aspect of the invention, a digital keyboard input device includes a plurality of I/O signal lines comprising N electrical conductors. (N−1) first electrical switches, wherein N is an integer greater than 2, each have one end thereof connected to a first one of the conductors and the other end thereof connected to a different one of the electrical conductors other than the first conductor. (N−2) second electrical switches each have one end thereof connected to a second one of the conductors and the other end thereof connected to a different one of the electrical conductors other than the first and second conductors. Logic circuitry (1) operates the electrical conductors, selectively, one at a time, in an output state to generate an output logic signal while (2) operating at least one other of the I/O signal lines in an input state for receiving the output logic signal from a selected I/O signal line in the first state via an operated electrical switch and (3) operating other ones of the I/O signal lines in a high impedance state. In response to the output state and output logic signal(s) received, the controller determines which one of the pluralities of first and second data input switches is operated.

In accordance with still another aspect of the invention, a digital keyboard input device further comprises a source of a reference logic signal and (N) third electrical switches. Each of the switches has one end thereof connected to a corresponding conductor and the other end thereof connected to the reference logic signal source.

In accordance with another aspect of the invention, the input state and the high impedance state of the I/O lines have a common electrical impedance characteristic.

In accordance with still another aspect of the invention, a method for inputting data from a digital keypad having a plurality of I/O signal lines and a plurality of switching means operable for providing an electrical path between one of the I/O signal lines and another of the I/O signal lines, comprising the steps of (a) operating one of the I/O signal lines in an output state and generating an output logic signal thereon and (b) operating others of the I/O lines in an input state and detecting the output reference signal thereon. In response to steps (a) and (b), in a step (c) an operation of the switching means is indicated.

In accordance with another aspect of the invention, a method includes providing a fixed source of the reference output signal and applying the reference output signal selectively to the I/O signal lines. The method additionally includes operating additional ones of the I/O line selectively in a high impedance state after the additional ones of the I/O lines are operated in the output state.

Still other objects and advantages of the present invention will become readily apparent to those skilled in this art from the following detailed description, wherein only the preferred embodiment of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BEST MODE FOR PRACTICING THE INVENTION

Figure 1:
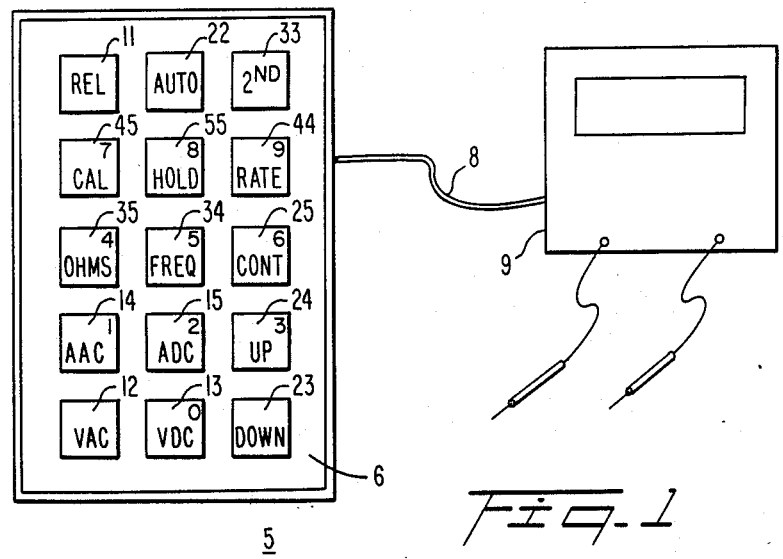
FIG. 1 is a keypad according to the invention connected to supply input data to a digital device.

Referring to FIG. 1, a keypad 5 constructed in accordance with the principles of the invention comprises a substrate 6 supporting thereon a two-dimensional array of keypad switches 11-55 which, when manually activated, apply corresponding signals along bus 8 to a device 9, such as an electrical parameter test instrument. In accordance with the invention, the keypad switches 11-55 are interconnected and controlled so that the number of switches can exceed the number of conductors of the bus 8.

Figure 2:
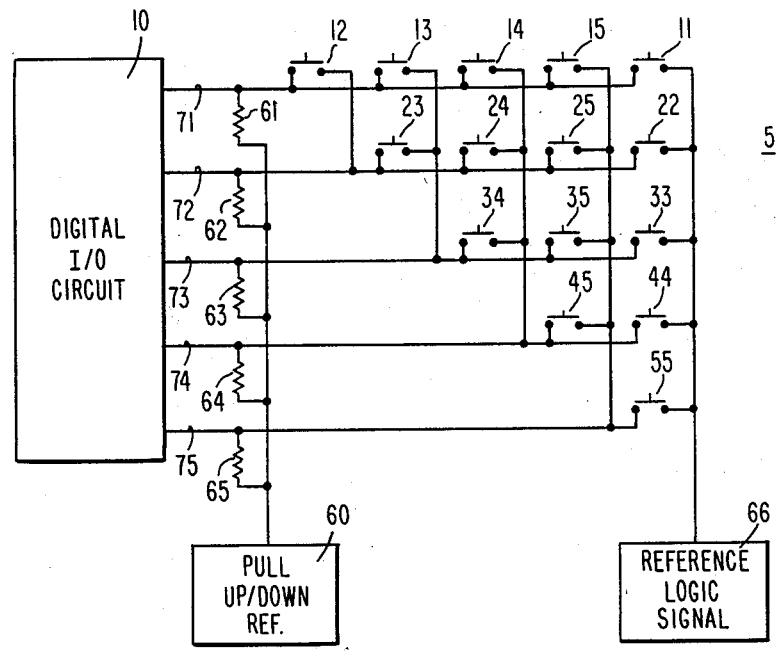
FIG. 2 is a circuit diagram of a fully populated preferred embodiment of a keyboard input device according to the invention.
Figure 3:
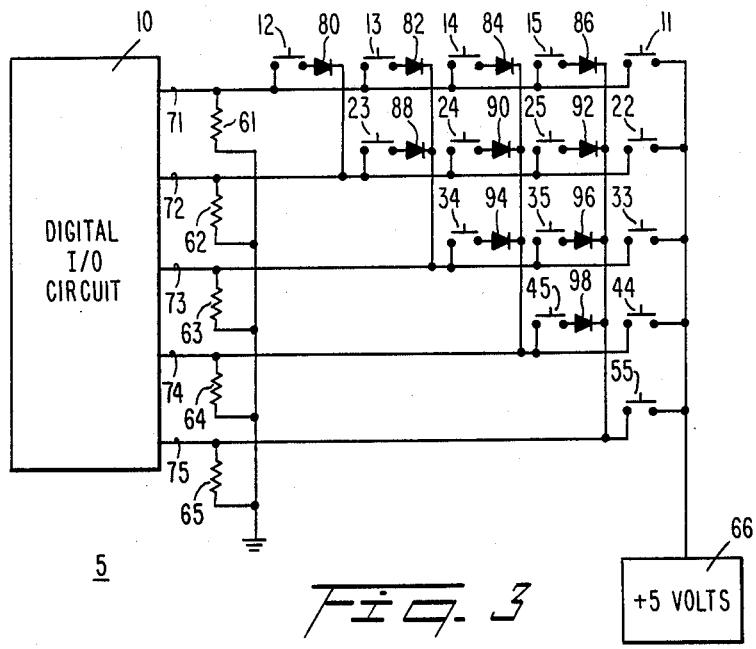
FIG. 3 is a circuit diagram of a preferred embodiment of a keyboard input device according to the invention including current blocking diodes to prevent false multiple switch detections.

The keypad 5, shown schematically in FIGS. 1-3, comprises a digital I/O circuit 10 which may be a a Hitachi 6303Y 8 bit single chip microprocessing unit, having connected thereto I/O lines 71-75; although five I/O lines are shown in the Figures, it should be understood that any other number of lines greater than two can be provided as well. The I/O circuit 10 operates the I/O lines 71-75 selectively in three different states. In a first state, viz., an output state, the circuit 10 applies on any line an output logic signal which may, for example, be a logic one signal. In a second or input state, the circuit 10 detects the logic state of an associated line to determine whether one of the switches 11-55 connected to another line in the output state is closed. And in the third or high impedance state, any line is rendered inactive. When any I/O line is in the high impedance state and is not otherwise loaded or driven, the line is maintained at a level determined by the pull up/down reference source 60, which corresponds to a logic 0 value. If positive logic is used with ground potential corresponding to a logic 0 value and a reference voltage level (typically +5 volts) representing a logic 1 value, then pull up/down reference source 60 is a source of ground potential and reference source 66 together with any I/O line operated in the output state are sources of a non-zero reference level signal, e.g. 5 volts. Conversely, if negative logic values are used, then source 60 is a pull up reference source of, e.g. 5 volts, and source 66 and any I/O line operated in an output state is driven to a zero volt ground potential.

Resistors 61-65 operate in cooperation with pull up/-down reference source 60 to maintain the associated I/O lines 71-75 at a voltage level corresponding to a logic 0 level when the I/O line is in the input state. Thus, using positive logic, resistors 61-65 act as pull down resistors through ground level source 60, and as pull up resistors through voltage source 60 using negative logic. For simplicity, the following discussion will assume positive logic wherein source 60 is a source of ground potential level, resistors 61-65 act as pull down resistors, and the output state results in the associated I/O line outputting a non-zero, i.e. 5 volt output logic signal. Further, with the assumed positive logic operations, reference source 66 generates the same non-zero output logic signal level as an output state operated I/O line so that this signal level is recognized by digital I/O circuit 10 as a logic 1 level.

Input through the keypad is achieved using manually operable data switches 11-15, 22-25, 33-35, 44-45 and 55. For ease of reference, the numeric switch designations indicate the effect of activation of that switch. Activation of any switch designated by two identical digits, i.e. 11, 22, etc., results in an electrical path between reference source 66 and the associated I/O signal line 71-75. For example, activation of switch 11 results in I/O signal line 71 driven to a logic 1 level by reference source 66. Activation of a switch designated by two different digits, e.g. 12, 24, 35, results in an electrical path between two of the I/O signal lines 71-75. Thus, switch 12 is manually operable to provide an electrical path between I/O signal lines 71 and 72.

The data keypad scanning operation of the Digital Keypad Input Device of FIG. 1 is summarized in the Table 1.

TABLE 1

| Step | I/O Line State | | | | | Keys Detected | Comb |
|---|---|---|---|---|---|---|---|
| | 71 | 72 | 73 | 74 | 75 | | |
| 1 | I | I | I | I | I | 11, 22, 33, 44, 55 | 32 |
| 2 | O | I | I | I | I | 12, 13, 14, 15 | 16 |
| 3 | Z | O | I | I | I | 23, 24, 25 | 8 |
| 4 | Z | Z | O | I | I | 34, 35 | 4 |
| 5 | Z | Z | Z | O | I | 45 | 2 |

In Table 1, input, output, and high impedance states are represented by the letters I, O, and Z, respectively. Further, the last column "Comb" refers to the possible combinations of states available for the given number of switches detectable in that step.

In the scan algorithm shown in Table 1, I/O signal line 75 is operated only in an input state, and I/O signal line 74 is operated in both an input and an output state, but not in a high impedance state. This latter observation is not particularly important in the embodiment described herein because the input operation state doubles as a high impedance state. Although the scan algorithm to be described is based on the sequence depicted in Table 1, other sequences are equally feasible. For example, Table 2 illustrates such an alternate scanning sequence.

TABLE 2

| Step | I/O Line State | | | | | Keys Detected | Comb |
|---|---|---|---|---|---|---|---|
| | 71 | 72 | 73 | 74 | 75 | | |
| 1 | I | I | I | I | I | 11, 22, 33, 44, 55 | 32 |
| 2 | I | I | I | I | O | 15, 25, 35, 45 | 16 |
| 3 | I | I | I | O | Z | 14, 24, 34 | 8 |
| 4 | I | I | O | Z | Z | 13, 23 | 4 |
| 5 | I | O | Z | Z | Z | 12 | 2 |

Referring to Table 1, in a first step, I/O signal lines 71-75 are operated in the input state to accept data input from and detect activation of switches 11, 22, 33, 44 and 55. Activation of any of this first group of switches causes the associated I/O signal line 71-75, respectively, to be driven to the positive logic value level generated by Reference Source 66. Note that while any of the switches in this first group can be separately and simultaneously activated and correctly detected, activation of any of the switches outside this group (i.e., switches 12-15, 23-25, 34, 35, 45) could result in an erroneous switch detection by shunting a positive output logic signal between different I/O signal lines 71-75. Therefore, scanning should be stopped if a switch activation is detected during this first step to avoid erroneous switch detection in subsequent steps.

In a second step, I/O signal line 71 is operated in an output state to output a logic 1 level signal, while I/O signal lines 72-75 are operated in the input state. Activation of any of a second group of switches 12, 13, 14 and 15 is detected by I/O signal lines 72, 73, 74 and 75, respectively, upon detection of the logic 1 level signal generated by I/O signal line 71. Again, while simultaneous activations of switches within this second group are distinguishable, operation of switches not within this group could result in erroneous switch detections. For example, in this second step, activation of switches 12 and 13 cannot be distinguished from activation of switches 12 and 23, switch 23 being outside the second grouping of switches. Thus, simultaneous switch activation should be restricted to switches within a single group and/or error detection, as will be described later, must be employed to avoid erroneous data input detection.

In a third step, I/O signal line 71 is operated in the high impedance state, I/O signal line 72 in the output state, and I/O signal lines 73, 74 and 75 are operated in the input state to detect activation of switches 23, 24 and 25. Similarly, in a fourth step, I/O signal line 73 is operated in the output state to detect activation of switches 34 and 35. Finally, I/O signal line 74 is operated in the output state to detect activation of switch 45. Note that because the switch topology is symmetric with respect to the I/O signal lines, the direction of scanning, i.e. I/O signal line 71 through 75, is not critical to device operation, as previously described. Thus, instead of sequentially operating I/O signal lines 71 through 74 in the output state, the sequence could be changed to serially operate I/O signal lines 75 through 72 in the output state. In this latter case, the sequence of switch detection groups is switches 11, 22, 33, 44, and 55; switches 15, 25, 35, and 45; switches 14, 24 and 34, switches 13 and 23; and switch 12, as indicted in Table 2.

As previously indicated, simultaneous activation of switches from different groups can cause erroneous data indications. For example, if switches 12 and 13 are simultaneously activated, this is detected during step 2, as shown in Table 1. However, continuing to step 3, wherein I/O signal line 72 is operated in the output state, a path from I/O signal line 72 to I/O signal line 73 exists through the series combination of switches 12 and 13, both having I/O signal line 71 in common. This series combination of switches is erroneously detected as a switch 23 activation. To prevent such a situation, current blocking diodes are preferably provided in series with at least some of the switches to permit multiple switch activations to be applied to the keyboard. FIG. 3 show such an arrangement wherein current blocking diodes 80-98 prevent an electrical path from being formed between two I/O signal lines through two switches having a third I/O line in common to form a series circuit.

While the addition of blocking diodes 80-98 prevents erroneous detections of valid multiple switch activations, i.e. switches within a single switch group, the diodes do not prevent erroneous switch detections if switches from different groups are activated. For example, if switches 12 and 23 are simultaneously activated, a current path is established from I/O signal line 71 to I/O signal line 72 and further onto I/O signal line 73 through switch 23. The result is an erroneous detection of switch 13 in addition to correctly sensed switch 12 at step 2. If scanning continues to step 3 wherein I/O signal line 72 is operated in the output state, operation of switch 23 operation is detected. Because switch activations from different groups are detected herein, an error signal is generated to indicate that an ambiguous detection condition has occurred.

To provide a unique binary value indicating activation of any legal combinations of switches, each I/O signal line is given a binary weighting value. For example, inputs received on I/O signal lines 75 have a binary weighted value of 1 (i.e. $2^0$), while inputs received on I/O signal line 71 have a weighted binary value of 16 (i.e. $2^4$), with intermediate I/O signal lines weighted accordingly (i.e. I/O signal line 74, 2; line 73, 4, line 72 8). In the next step, each I/O signal line is additionally weighted by the combinations detectable in previous steps. The possible combinations for any one step are shown in the last column of Tables 1 and 2. Thus, in step 2, I/O signal lines 75 through 72 have and offset of 32 (5 detectable switches, or $2^5$) resulting weighting values of 33, 34, 36 and 40 respectively. In step 3, I/O signal lines are offset by the total of all previous combinations, or 48 ($2^5+2^4$), resulting in I/O signal lines 75, 74 and 73 having weighted values or 49, 50 and 52, respectively. In step 4 I/O signal lines 75 and 74 are offset by 56 (48 as previously calculated plus 8 representing the possible combinations from step 3) and therefore have weighted values of 57 and 58. Finally, any input received at I/O signal line 75 in step 5 would have a weighted value of 61. Thus, activation of switches 12-55 can determined according to this encoding technique, as shown in table 3.

TABLE 3

| Key | Value | Key | Value | Key | Value |
|-----|-------|-----|-------|-----|-------|
| 11  | 16    | 22  | 8     | 34  | 58    |
| 12  | 40    | 23  | 52    | 35  | 57    |
| 13  | 36    | 24  | 50    | 44  | 2     |
| 14  | 34    | 25  | 49    | 45  | 61    |
| 15  | 33    | 33  | 4     | 55  | 1     |

Combinations of simultaneous activated key switches also provide unique binary values, as shown in Table 4.

TABLE 4

| Keys   | Value | Keys         | Value |
|--------|-------|--------------|-------|
| 12, 13 | 76    | 24, 25       | 99    |
| 12, 14 | 74    | 34, 35       | 114   |
| 12, 15 | 73    | 12, 13, 14   | 110   |
| 13, 14 | 70    | 12, 13, 15   | 109   |
| 13, 15 | 69    | 12, 14, 15   | 107   |
| 14, 15 | 67    | 13, 14, 15   | 103   |
| 23, 24 | 102   | 23, 24, 25   | 151   |
| 23, 25 | 101   | 12, 13, 14, 15 | 143 |

It is again noted that all switch combinations must be from the same group. Further, because simultaneous multiple switch activations result in a detected value which is the sum of the individual key switch values, debouncing can be easily accomplished by buffering the binary output value and outputting or latching the maximum value obtained over any period of time when a non-zero binary value is detected.

The maximum number of input switches "S" is a function of the number of available I/O signal lines "N". Thus, the maximum number of switches S is equal to the number of I/O signal lines N plus the combination of N things taken two at-a-time. This is expressed as:

$$S = \frac{N(N+1)}{2}$$

Figure 4:
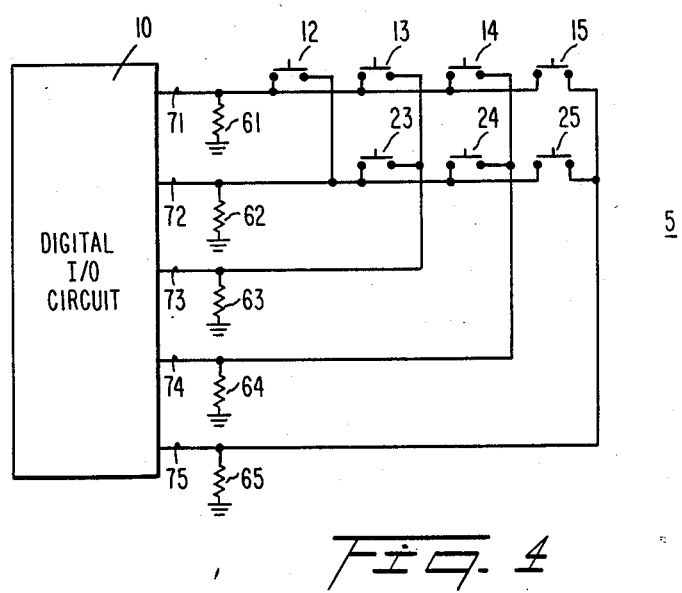
FIG. 4 is a circuit diagram of a partially populated preferred embodiment of a keyboard according to the invention.

However, the invention is equally applicable to digital keypad input devices that do not require the maximum number of keys which can be accommodated by a given number of I/O signal lines. FIG. 4 shows such an arrangement wherein, although five I/O signal lines are available, only 7 switches, 12-15 and 23-25, are provided. Because this embodiment is not fully populated with switches, the apparatus requires only a two step scanning process. In one step, I/O signal line 71 is operated in the output state, while I/O signal lines 72-75 are operated in the input state to detect activation of switches 12-15. In the other step, I/O signal line 72 is operated in the output state, while I/O signal lines 73-75 are operated in the input state to detect activation of switches 23-25. The input device shown in FIG. 4 uses positive logic levels wherein ground potential level indicates that no button is activated, or "zero". Further, the device of FIG. 4 does not require an external reference source, but instead relies on reference levels generated by I/O signal lines 71 and 72 operated in the output state.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

What is claimed is:

1. A digital keypad input device, comprising:
   a plurality of I/O signal lines, each selectively operable to have (a) a high impedance state, (b) an input state for carrying an input logic signal and (c) an output state for carrying an output logic signal;
   a plurality of manually operable data input switching means each providing, when operated, an electrical path between a corresponding one of said I/O signal lines and another one of said I.O signal lines; and
   control logic means for operating said I/O signal lines selectively, one at a time, in said output state and generating said output logic signal while operating at least one other of said I/O signal lines in said input state and receiving said output logic signal from a selected I/O signal lines in said output state via an operated one of said data input switching means and for operating other ones of said I/O signal lines in said high impedance state, and in response, determining which one or ones of said plurality of manually operable data input switching means are said operated switching means,
   each of said I/O signal lines having an associated binary weighting and said control logic means including means for calculating a binary value corresponding to a sum of (a) a binary weighting of each I/O line on which said logic level signal is received and (b) a binary offset value corresponding to any I/O signal line being operated in said output state, said offset value being greater than a maximum binary weighting value of said I/O signal lines.

2. A digital input device, comprising:
   a plurality of I/O signal lines, a first one of said plurality of I/O signal lines operable to have an input state for carrying an input logic level signal; a second one of said plurality of I/O lines operable selectively in (a) said input state and (b) an output state for carrying an output logic signal; and remaining ones of said plurality of I/O signal lines operable selectively in (a) said input state, (b) said output state, and (c) a high impedance state;
   a plurality of manually operable data input switching means each providing, when operated, an electrical path between a corresponding one of said I/O signal lines and another one of said I/O signal lines; and
   control logic means for operating said second one and said remaining I/O signal lines selectively, one at a time, in said output state and generating said output logic signal while operating at least said first I/O signal line in said output state and receiving said output logic signal from a selected I/O signal line in said output state through an operated one of said data input switching means and for operating other ones of said I/O signal lines in said high impedance state, and in response, determining which one or ones of said plurality of manually operable date input switching means are said operated switching means
   each of said I/O signal lines having an associated binary weighting and said control logic means including means for calculating a binary value corresponding to a sum of (a) a binary weighting of each I/O line on which said logic level signal is received and (b) a binary offset value corresponding to any I/O signal line being operated in said output state, said offset value being greater than a maximum binary weighting value of said I/O signal lines.

3. A digital input device in accordance with claim 2, further comprising a source of a reference logic signal and wherein said data input switching means includes additional manually operable data input switching means for selectively providing said reference logic signal to a corresponding I/O signal line.

4. A digital input device in accordance with claim 3, wherein one of said plurality of I/O signal lines operated in said output state serves as said source of said reference logic signal.

5. A digital input device in accordance with claim 2, wherein said data input switching means comprises a plurality of first switches, each of said I/O signal lines connectable respectively to all others of said I/O signal lines through said plurality of first switches, said data input switching means further comprising second switches for applying said reference logic signal to corresponding ones of said I/O signal lines, wherein said control means includes means for operating said I/O lines in said input state for receiving output logic and reference logic signal on said I/O lines.

6. A digital input device in accordance with claim 2, wherein said plurality of data input switching means includes switches for establishing selectively electrical paths between corresponding ones of said I/O signal lines, and all other ones of said I/O signal lines.

7. A digital input device in accordance with claim 2, wherein said input state and said high impedance state have a common electrical impedance characteristic.

8. A digital input device in accordance with claim 2, wherein said control logic means generates an error signal upon receiving said output logic signal from two different I/O signal lines operated in said output state.

9. A digital input device in accordance with claim 2, including debouncing means for outputting a maximum binary value corresponding to a plurality of said calculated binary values.

10. A digital input device in accordance with claim 2, wherein said control logic means sequentially operates each of said I/O signal lines in said output state.

11. A digital input device in accordance with claim 2, wherein said controllogic means operates all of said I/O signal lines in said input state and operates each of said I/O signal lines sequentially in said output state.

12. A digital input device in accordance with claim 3 including means for establishing a unidirectional current path through said switching means.

13. A digital keypad input device comprising:
   a source of a reference logic signal;

N I/O signal lines (N>2), respectively operable to have (a) a high impedance state, (b) an input state for carrying an input logic signal level and (c) an output state for carrying an output logic signal;

a first group of N(N−1)/2 switches, each operable to provide an electrical path between a corresponding one of said I/O signal lines and another of said I/O signal lines thereby selectively providing an electrical path through a corresponding switch from all of said I/O signal lines to all others of said I/O signal lines;

a second group of N switches, each operable to apply said reference logic signal to a corresponding one of said I/O signal lines;

an I/O controller for operating said N I/O signal lines in said input state and detecting a reference logic signal and an output logic signal on one of said I/O signal lines corresponding to an operation of one of said second group of switches, and for operating one of said N I/O signal lines in an output state to detect said output logic signal on at least one of said N I/O signal lines thereby to detect any operation of at least on of said first group of switches, each of said I/O signal lines having an associated binary weighting and said I/O controller including means for calculating a binary value corresponding to a sum of (a) a binary weighting of each I/O line on which said logic level signal is received and (b) a binary offset value corresponding to any I/O signal line being operated in said output state, said offset value being greater than a maximum binary weighting value of said I/O signal lines.

14. A digital keyboard input device, comprising:
a plurality of I/O signal lines comprising N electrical conductors;
(N−1) first electrical switches, wherein N is an integer greater than 2, each having one end thereof connected to a first one of said conductors and the other end thereof connected to a different one of said electrical conductors other than said first conductor;
(N−2) second electrical switches, each having one end thereof connected to a second one of said conductors and the other end thereof connected to a different one of said electrical conductors other than said first and second conductors; and
an I/O controller for operating said plurality of I/O signal lines in said input state and detecting a reference logic signal and an output logic signal on one of said I/O signal lines corresponding to an operation of one of said second switches, and for operating one of said plurality of I/O signal lines in an output state and the remaining ones of said plurality of I/O signal lines in an input state to detect said output logic signal on at least one of said plurality of I/O signal lines; thereby to detect any operation of at least one of said plurality of first switches,
each of said I/O signal lines having an associated binary weighting and said I/O controller including means for calculating a binary value corresponding to a sum of (a) a binary weighting of each I/O line on which said logic level signal is received and (b) a binary offset value corresponding to any I/O signal line being operated in said output state, said offset value being greater than a maximum binary weighting value of said I/O signal lines.

15. A digital keyboard input device in accordance with claim 14, further comprising a source of a reference logic signal and further comprising (N) third electrical switches each having one end thereof connected to a corresponding conductor and the other end thereof connected to said reference logic signal source.

16. A digital keyboard input device in accordance with claim 14, wherein said input state and said high impedance state have a common electrical characteristic.

17. A method for inputting data from a digital keypad having I/O signal lines and switching means operable for providing an electrical path between one of said I/O lines and another of said I/O lines, comprising the steps of:
(a) associating a binary weighting with ones of said I/O signal lines operated in an input state;
(b) associating a binary offset value corresponding to ones of said I/O signal lines operated in an output state;
(c) operating predetermined ones of said I/O signal lines in said output state and generating an output logic signal thereon;
(d) operating others of said I/O lines in said input state and detecting said output logic signal thereon; and
in response to steps (c) and (d),
(e) calculating a binary value corresponding to a sum of (i) said binary weighting of each I/O line on which said logic level signal is received and (ii) said binary offset value associated with a corresponding one of said I/O signal lines operated in said output state from which said logic level signal is received.

18. A method for inputting data from a digital keypad as recited in claim 17, further comprising the steps of:
providing a fixed source of said reference output signal; and
applying said reference output signal selectively to said I/O signal lines.

19. A method for inputting data from a digital keypad as recited in claim 17, further comprising the step of operating additional ones of said I/O lines selectively in a high impedance state after said additional ones of said I/O lines are operated in said output state.

20. A method for inputting data from a digital keypad having N I/O signal lines configured as rows 1 to N and N(N−1)/2 switching means, each I/O line i, where i varies from 1 to N, having connected thereto (N−i) switching means j, where j varies from 1 to (N−i), each of said switching means selectively operable for providing an electrical path between said I/O line i and I/O line (i+j), comprising the steps of:
(a) assigning each I/O line i an input mode weighting value equal to $2^{(N-i)}$ and an offset value equal to the sum from 1 to i of $2^{(N-i)}$,
(b) sequentially operating N−1 of said I/O signal lines k from 1 to N−1 in an output state and generating an output logic signal thereon while operating (N−k) I/O of said lines from (k+1) to N in an input state and detecting said output reference signal thereon; and
in response to steps (a) and (b),
(c) accumulating sums of (i) respective input mode weighting values associated with a line on which said output logic signal is detected plus (ii) the corresponding offset value associated with the I/O line on which said output logic signal is generated, thereby indicating an operation of said switching means.

* * * * *